US010804893B2

(12) United States Patent
Akahane

(10) Patent No.: US 10,804,893 B2
(45) Date of Patent: Oct. 13, 2020

(54) DRIVE CIRCUIT

(71) Applicant: FUJI ELECTRIC CO., LTD., Kawasaki-shi, Kanagawa (JP)

(72) Inventor: Masashi Akahane, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/774,850

(22) Filed: Jan. 28, 2020

(65) Prior Publication Data

US 2020/0295749 A1   Sep. 17, 2020

(30) Foreign Application Priority Data

Mar. 11, 2019   (JP) .................... 2019-043760

(51) Int. Cl.
*H03K 19/00*   (2006.01)
*H03K 17/16*   (2006.01)
*H03K 3/356*   (2006.01)

(52) U.S. Cl.
CPC .......... *H03K 17/162* (2013.01); *H03K 3/356* (2013.01)

(58) Field of Classification Search
CPC ... H03K 19/017509; H03K 19/018521; H03K 19/00315; H03K 19/00361; H03K 17/063; H03K 17/04123; H03K 17/04126; H03K 17/162; H03K 17/168; H03K 17/687; H03K 3/356; H03K 3/356113; H03K 2217/0036; H03K 2217/0063; H03K 2217/0072
See application file for complete search history.

(56) References Cited

U.S. PATENT DOCUMENTS 9,621,151 B2 *   4/2017   Kanda ................ H03K 3/356
10,224,921 B2 *   3/2019   Kanda ............ H03K 3/356113

FOREIGN PATENT DOCUMENTS

| JP | 2001-258268 A | 9/2001 |
| JP | 3429937 B2 | 7/2003 |
| JP | 2011-015136 A | 1/2011 |
| WO | 2016/009719 A1 | 1/2016 |
| WO | 2016/163142 A1 | 10/2016 |

* cited by examiner

*Primary Examiner* — Long Nguyen
(74) *Attorney, Agent, or Firm* — Rabin & Berdo, P.C.

(57) ABSTRACT

A drive circuit of a power device, including an internal power supply, a set-side pulse generation circuit and a reset-side pulse generation circuit that are connected to the internal power supply, for generating a set signal and a reset signal respectively upon detecting that a logic input signal changes from a first logic level to a second logic level, or changes from the second logic level to the first logic level, a set-side level shift circuit and a reset-side level shift circuit that respectively level-shift the set signal and the reset signal, a control circuit that turns on and off the power device respectively responsive to the level-shifted set signal and the level-shifted reset signal, and an ensuring circuit that ensures a first state and a second state, in which the power device is respectively off and on, when the logic input signal is at the first logic level and the second logic level.

19 Claims, 6 Drawing Sheets

DRIVE CIRCUIT

CROSS-REFERENCE TO RELATED APPLICATIONS

The present application claims priority pursuant to 35 U.S.C. § 119 from Japanese patent application number 2019-043760, filed on Mar. 11, 2019, the entire disclosure of which is hereby incorporated by reference herein.

BACKGROUND

Technical Field

The present disclosure relates to a drive circuit that drives a power device.

Description of the Related Art

As disclosed in International Patent Application Publication Nos. WO2016/163142 and WO2016/009719, a half bridge circuit includes first and second power switching devices coupled in series between a high potential terminal and a low potential terminal of a power supply, and a node between the first power switching device and the second power switching device is coupled to a load such as a motor. The load is driven by turning on and off the first power switching device and turning on and off the second power switching device complementarily to the first power switching device. The second power switching device is turned on and off by being driven by a low-side control circuit that operates with the potential of the low potential terminal of the power supply being used as the reference potential. The first power switching device is turned on and off by being driven by a high-side control circuit that operates with the potential of the node between the first power switching device and the second power switching device being used as the reference potential.

A level shift circuit is coupled to a previous stage of the high-side control circuit and a preceding-stage circuit is coupled to a previous stage of the level shift circuit. The high-side control circuit and the level shift circuit operate at high voltage and the preceding-stage circuit operates at low voltage. The preceding-stage circuit generates a pulsed set signal and reset signal based on logic input signals from the outside, and the level shift circuit shifts the levels of the set signal and the reset signal. The high-side control circuit generates the drive signal based on the level-shifted set signal and reset signal, and turns the first power switching device on and off according to the drive signal.

When the first and second power switching devices are switched between on and off, the potential of the node between the first power switching device and the second power switching device falls below the potential of the low potential terminal of the power supply by being affected by the inductance of the load, and the voltage at the node may become negative. When such negative voltage is generated, the operation of the preceding-stage circuit is not stabled, so that the set signal and the reset signal are not stably outputted from the preceding-stage circuit. Even when the voltage at the node recovers from such a negative voltage state to the normal state, the levels of the set signal and the reset signal may become erroneous, and the high-side control circuit may malfunction.

The present disclosure has been achieved in view of the aforementioned issues, and an object thereof is to operate a control circuit that drives a power device normally even after a negative voltage is generated at a node coupled to the power device.

SUMMARY

A main aspect of the present disclosure for achieving an object described above is a drive circuit comprising: a set-side pulse generation circuit that generates a set signal with an internal power supply when an logic input signal inputted from an exterior changes from a first logic level to a second logic level; a reset-side pulse generation circuit that generates a reset signal with the internal power supply when the logic input signal changes from the second logic level to the first logic level; a set-side level shift circuit that generates a level-shifted set signal by shifting a level of the set signal; a reset-side level shift circuit that generates a level-shifted reset signal by shifting a level of the reset signal; a control circuit that turns on a power device based on the level-shifted set signal, and turns off the power device based on the level-shifted reset signal; and an ensuring circuit that ensures, based on the logic input signal, a state where the power device is off when the logic input signal is at the first logic level, and the power device is on when the logic input signal is at the second logic level.

According to an aspect of the present disclosure, it is possible that a control circuit that drives a power switching device is operated normally.

BRIEF DESCRIPTION OF THE DRAWINGS

FIG. 5 is a timing chart illustrating, on a time axis, relationships among voltages at nodes, an input signal, an output signal, and output signals of pulse generation circuits, after a high-side power switching device is switched off from on.

DETAILED DESCRIPTION

At least the following matters are apparent from the description of the present specification and the attached drawings.

EMBODIMENT

An embodiment of the present disclosure is described below with reference to the drawings. Note that various limitations which are technically preferable for implementing the present disclosure are added to an embodiment described below. Thus, the present disclosure is not limited to the following embodiment and illustrated examples.

1. OUTLINE OF DRIVE CIRCUIT AND OUTPUT CIRCUIT

Figure 1:
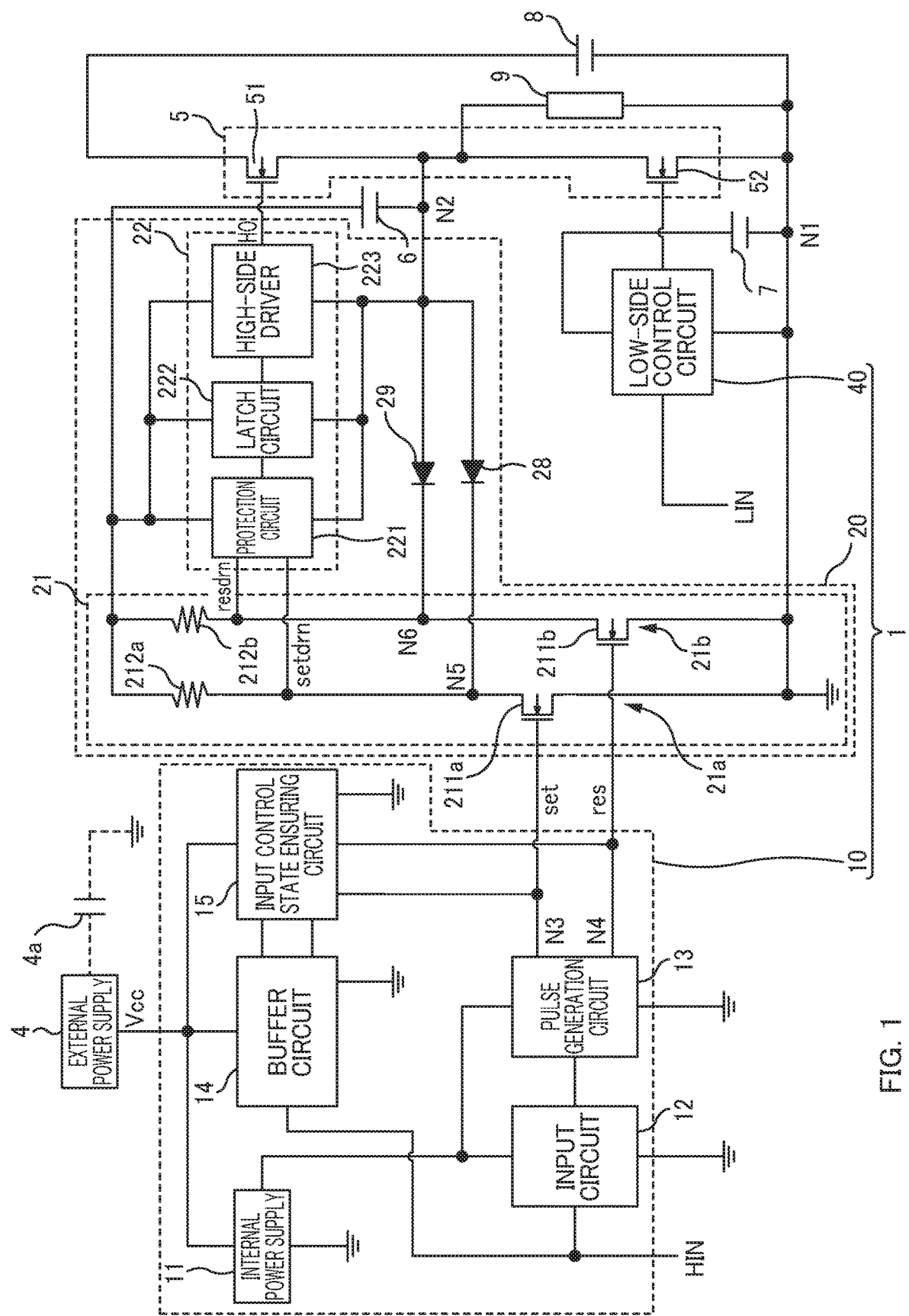
FIG. 1 is a diagram illustrating a drive circuit, an output circuit, a load, and an external power supply.
Figure 2:
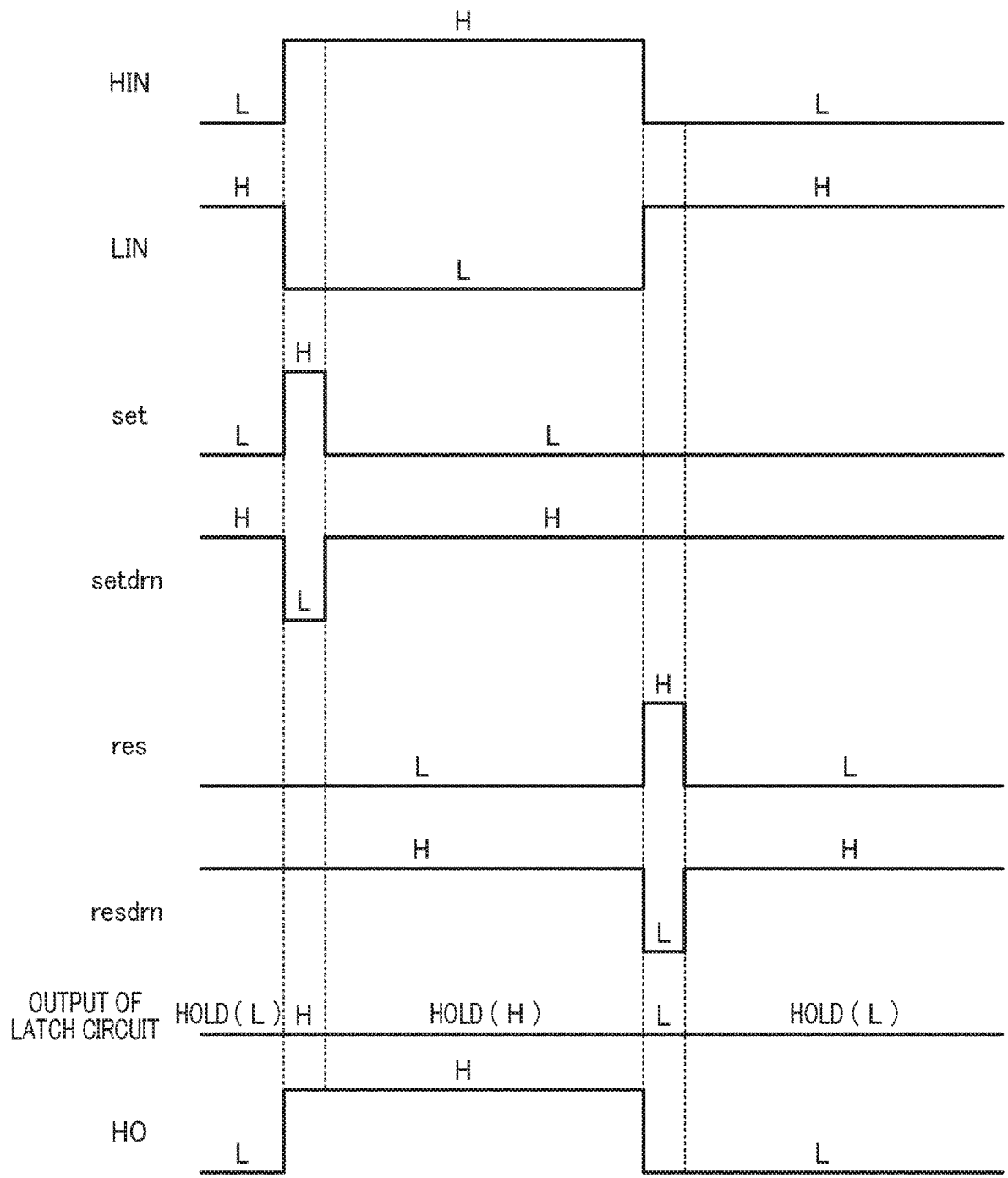
FIG. 2 is a timing chart illustrating, on a time axis, relationships among a high-side input signal, a low-side input signal, a set signal, a level-shifted set signal, a reset signal, a level-shifted reset signal, an output of a latch circuit, and an output signal.

FIG. 1 is a diagram illustrating a drive circuit 1, an output circuit 5, a load 9, and an external power supply 4. FIG. 2 is a timing chart illustrating relationships among an input signal HIN, an input signal LIN, a set signal set, a level-shifted set signal setdrn, a reset signal res, a level-shifted reset signal resdrn, an output of a latch circuit 222, and an output signal HO.

The external power supply 4 generates a constant DC voltage and supplies the DC voltage to the drive circuit 1.

The external power supply 4 is coupled to a capacitor 4a having a large capacitance. Thus, noise generated in the drive circuit 1, the output circuit 5, and the like are removed by the capacitor 4a, so that the external power supply 4 is not affected by the noise. Accordingly, the output voltage of the external power supply 4 is stable.

The drive circuit 1 is operated by receiving the high-side input signal HIN and the low-side input signal LIN from a microcomputer (not illustrated). The input signal HIN and the input signal LIN are logic input signals which repeatedly change between a first logic level and a second logic level. In this description, the first logic level refers to a low level and the second logic level refers to a high level.

The input signal HIN and the input signal LIN are commonly in a relationship complementary to each other. Specifically, when the input signal HIN is high, the input signal LIN is low and, when the input signal HIN is low, the input signal LIN is high.

Note that the microcomputer is not affected by the noise generated in the drive circuit 1, the output circuit 5, and the like. Accordingly, the microcomputer stably outputs the input signal HIN and the input signal LIN.

When the drive circuit 1 drives the output circuit 5 based on the high-side input signal HIN and the low-side input signal LIN, the output circuit 5 repeatedly and alternately switches the state of the load 9 between a voltage applied state in which voltage of a high-voltage DC power supply 8 is applied to the load 9 and a ground voltage applied state in which ground voltage is applied to the load 9.

The output circuit 5 includes power switching devices 51, 52 forming a half bridge. The power switching devices 51 and 52 are N-channel power MOSFETs but may be power devices such as IGTBs or bipolar transistors. The power switching devices 51 and 52 are coupled in series between a high-potential output terminal and a low-potential output terminal of the high-voltage DC power supply 8. A node N1 between the power switching device 52 and the low-potential output terminal of the high-voltage DC power supply 8 is grounded, and the node N1 results in a reference potential. A node N2 between the power switching device 51 and the power switching device 52 is coupled to one end of the load 9. The other end of the load 9 is grounded. The node N2 is coupled to a low-potential output terminal of a high-side DC power supply 6.

The drive circuit 1 turns on and off the power switching device 51 based on the high-side input signal HIN. Furthermore, the drive circuit 1 turns on and off the power switching device 52 complementarily to the power switching device 51 based on the low-side input signal LIN. When the power switching device 51 is on and the power switching device 52 is off, the potential of the node N2 results in the output voltage of the high-voltage DC power supply 8 and the load 9 becomes the voltage applied state. When the power switching device 51 is off and the power switching device 52 is on, the potential of the node N2 results in the reference potential and the load 9 becomes the ground voltage applied state. Accordingly, the potential of the node N2 can vary between the reference potential and the output voltage of the high-voltage DC power supply 8. Note that the load 9 changes from the voltage applied state to the ground voltage applied state after a dead time. In the dead time, both of the power switching devices 51, 52 are turned off to avoid short circuit and through current in the high-voltage DC power supply 8. Similarly, the load 9 changes from the ground voltage applied state to the voltage applied state after a dead time.

2. CONFIGURATION OF DRIVE CIRCUIT

The drive circuit 1 includes a preceding-stage circuit 10, a subsequent-stage circuit 20, and the low-side control circuit 40.

The drive circuit 1 is built in a single chip. However, the drive circuit 1 may be configured such that the preceding-stage circuit 10 and the subsequent-stage circuit 20 are built in the same chip and the low-side control circuit 40 is built in another chip. Alternatively, the drive circuit 1 may be configured such that the preceding-stage circuit 10 and the low-side control circuit 40 are built in the same chip and the subsequent-stage circuit 20 is built in another chip. The drive circuit 1 may be configured such that the subsequent-stage circuit 20 and the low-side control circuit 40 are built in the same chip and the preceding-stage circuit 10 is built in another chip. As another alternative, the drive circuit 1 may be configured such that the preceding-stage circuit 10, the subsequent-stage circuit 20, and the low-side control circuit 40 are built in separate chips, respectively.

The preceding-stage circuit 10 operates at low voltage and the subsequent-stage circuit 20 operates at high voltage.

The preceding-stage circuit 10 includes an internal power supply 11, an input circuit 12, a pulse generation circuit 13, and a buffer circuit 14. The subsequent-stage circuit 20 includes a level shift circuit 21, a high-side control circuit 22, and diodes 28 and 29.

<<<2-1. Low-side Control Circuit>>>

The low-side control circuit 40 is supplied with power from a low-side DC power supply 7 and receives the input signal LIN from the microcomputer. The low-side control circuit 40 turns on and off the power switching device 52 complementarily to the power switching device 51 based on the input signal LIN.

<<<2-2. Internal Power Supply>>>

The internal power supply 11 is supplied with power from the external power supply 4, and generates, from the power of the external power supply 4, a constant DC voltage lower than the output voltage of the external power supply 4. The internal power supply 11 supplies the DC voltage to the input circuit 12 and the pulse generation circuit 13.

<<<2-3. Input Circuit>>>

Figure 3:
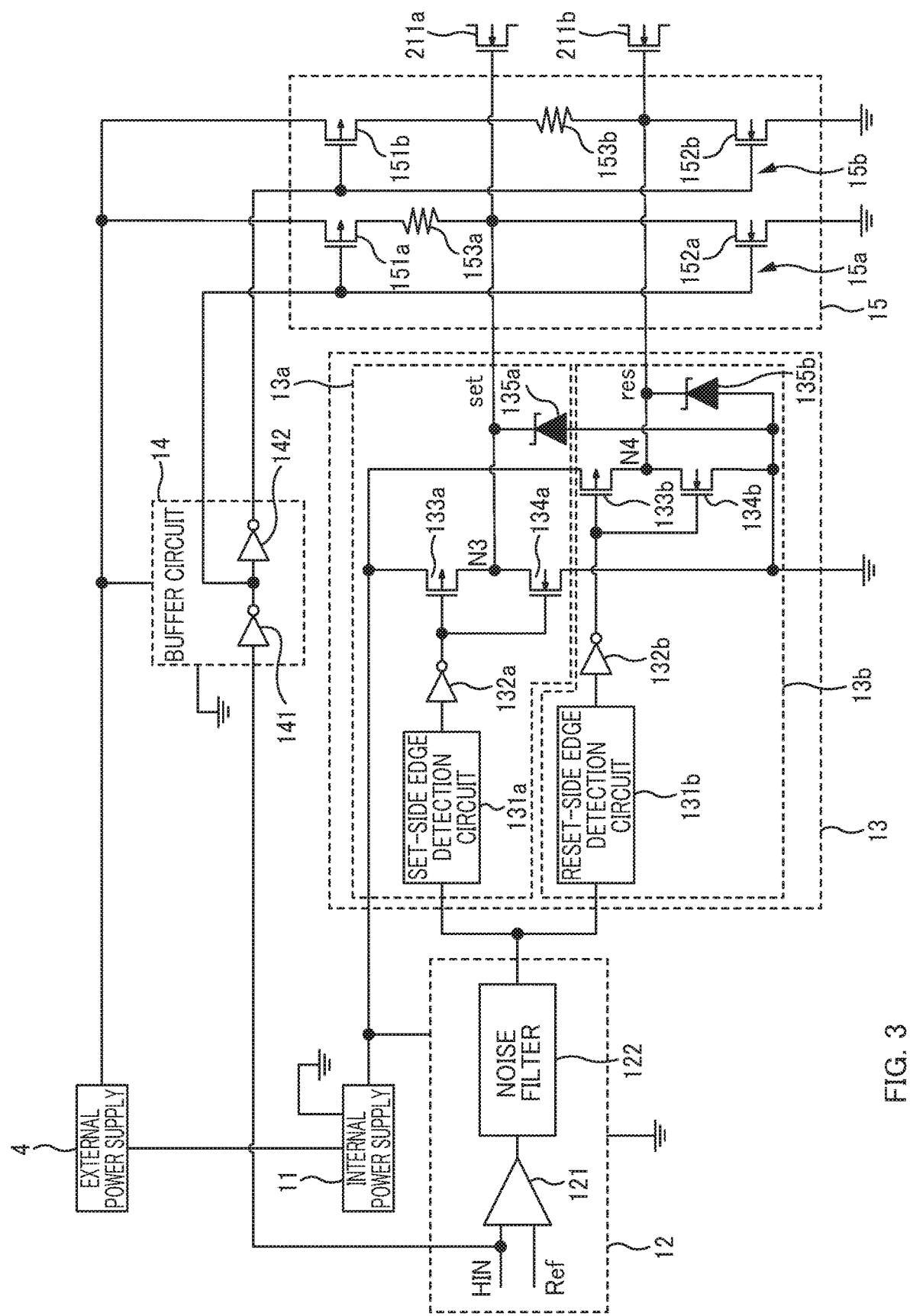
FIG. 3 is a diagram illustrating an external power supply and a preceding-stage circuit of the drive circuit.
Figure 4:
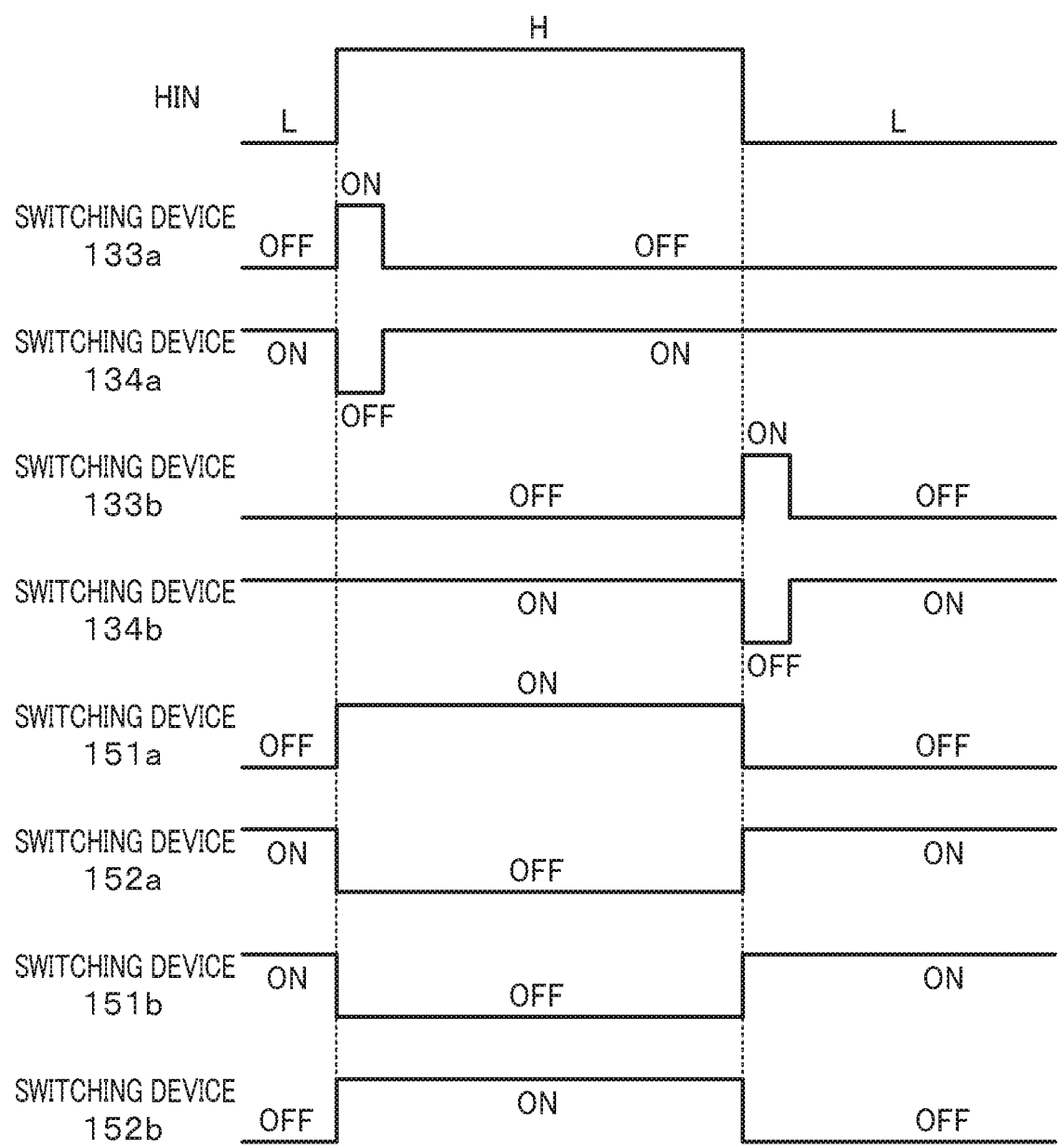
FIG. 4 is a timing chart illustrating, on a time axis, relationships among a high-side input signal and states of switching devices.

FIG. 3 is a diagram illustrating the input circuit 12, the pulse generation circuit 13, the buffer circuit 14, and an input-control-state-ensuring circuit 15. FIG. 4 is a timing chart illustrating relationships among the states of switching devices 133a, 134a, 133b, and 134b of the pulse generation circuit 13, the states of the switching devices 151a, 152a, 151a, and 151b of the input-control-state-ensuring circuit 15, and the input signal HIN.

The input circuit 12 includes a comparator 121 and a noise filter 122. The comparator 121 compares a reference voltage Ref generated by the internal power supply 11 and the level of the input signal HIN. When the level of the input signal HIN is higher than the reference voltage Ref, the output signal of the comparator 121 is high. When the level of the input signal HIN is lower than the reference voltage Ref, the output signal of the comparator 121 is low.

The noise filter 122 is, for example, a low-pass filter. The noise filter 122 removes noise in the output signal of the comparator 121. The output signal with its noise removed by the noise filter 122 is the output signal of the input circuit 12, and this output signal is inputted to the pulse generation circuit 13. If a delay of the input circuit 12 is ignored, the output signal of the input circuit 12 is in synchronization with the input signal HIN.

<<<2-4. Pulse Generation Circuit>>>

The pulse generation circuit 13 includes a set-side pulse generation circuit 13a and a reset-side pulse generation circuit 13b. When the output signal of the input circuit 12 changes from low to high, the set-side pulse generation circuit 13a generates a pulse and outputs the set signal set (see FIG. 2) whose level is high when this pulse is generated and whose level is low when this pulse disappears. Further, when the output signal of the input circuit 12 changes from high to low, the reset-side pulse generation circuit 13b generates a pulse and outputs the reset signal res (see FIG. 2) whose level is high when this pulse is generated and whose level is low when this pulse disappears. The timing in which the level of the set signal set is high is shifted in time from the timing in which the level of the reset signal res is high. The set signal set and the reset signal res are inputted to the level shift circuit 21 of the subsequent-stage circuit 20

The set-side pulse generation circuit 13a includes a set-side edge detection circuit 131a, an inverter 132a, a switching device (third switching device) 133a, a switching device (fourth switching device) 134a, and a set-side zener diode (set-side clamp device) 135a. The reset-side pulse generation circuit 13b includes a reset-side edge detection circuit 131b, an inverter 132b, a switching device (seventh switching device) 133b, a switching device (eighth switching device) 134b, and a reset-side zener diode (reset-side clamp device) 135b.

The set-side edge detection circuit 131a generates a pulse when detecting a rising edge at which the output signal of the input circuit 12 changes from low to high. The set-side edge detection circuit 131a outputs, to an inverter 132a, a signal whose level is high when the pulse is generated and whose level is low when the pulse disappears. The inverter 132a inverts the output signal of the set-side edge detection circuit 131a, and outputs the inverted signal to the gates of the switching device 133a and the switching device 134a.

The switching device 133a is a P-channel MOSFET, and the switching device 134a is an N-channel MOSFET. The source of the switching device 133a is coupled to the internal power supply 11, the drain of the switching device 133a is coupled to the drain of the switching device 134a, and the source of the switching device 134a is grounded resulting in the reference potential.

The set-side zener diode 135a is coupled between a node N3 and the ground in a reverse biased manner. In other words, the cathode of the set-side zener diode 135a is coupled to the node N3, and the anode of the set-side zener diode 135a is coupled to the ground resulting in the reference potential. Note that the breakdown voltage (e.g., 5.5 V) of the set-side zener diode 135a is higher than the output voltage (e.g., 5 V) the internal power supply 11 and lower than the output voltage (e.g., 30 V) of the internal power supply 4. Accordingly, the set-side zener diode 135a clamps the voltage at the node N3, which is coupled to the gate of the set-side level shift switching device 211a described later, to the breakdown voltage so that the voltage at the node N3 will not rise higher than necessary.

When the output signal of the inverter 132a is low, that is, the input signal HIN rises, the switching device 133a is turned on and the switching device 134a is turned off (see FIG. 4). Thus, the voltage of the internal power supply 11 is applied to the node N3, and the voltage at the node N3 becomes a high level. When the output signal of the inverter 132a is high, the switching device 133a is turned off and the switching device 134a is turned on. Thus, the voltage at the node N3 results in a low level serving as a reference potential. The voltage at the node N3 is outputted as the set signal set.

The reset-side edge detection circuit 131b generates a pulse, when detecting a falling edge at which the output signal of the input circuit 12 changes from high to low. The reset-side edge detection circuit 131b outputs, to the inverter 132b, a signal whose level is high when the pulse is generated and whose level is low when the pulse disappears. The inverter 132b inverts the output signal of the reset-side edge detection circuit 131b, and outputs the inverted signal to the gates of the switching device 133b and the switching device 134b.

The switching devices 133b is a P-channel MOSFET, and the switching device 134b is an N-channel MOSFET. The source of the switching device 133b is coupled to the internal power supply 11, the drain of the switching device 133b is coupled to the drain of the switching device 134b, and the source of the switching device 134b is grounded resulting in the reference potential.

The reset-side zener diode 135b is coupled between a node N4 and the ground in a reverse biased manner. In other words, the cathode of the reset-side zener diode 135b is coupled to the node N4, and the anode of the reset-side zener diode 135b is coupled to the ground resulting in the reference potential. Note that the breakdown voltage (e.g., 5.5 V) of the reset-side zener diode 135b is as in the set-side zener diode 135a. Accordingly, the reset-side zener diode 135b clamps the voltage at the node N4, which is coupled to the gate of the reset-side level shift switching device 211b described later, to the breakdown voltage so that the voltage at the node N4 will not rise higher than necessary.

When the output signal of the inverter 132b is low, that is, the input signal HIN falls, the switching device 133b is turned on and the switching device 134b is turned off (see FIG. 4). Thus, the voltage of the internal power supply 11 is applied to the node N4, and the voltage at the node N4 becomes a high level. When the output signal of the inverter 132b is high, the switching device 133b is turned off and the switching device 134b is turned on. Thus, the voltage at the node N4 results in a low level serving as the reference potential.

<<<2-5. Level Shift Circuit and Clamp Diodes>>>

As illustrated in FIG. 1, the level shift circuit 21 includes a set-side level shift circuit 21a and a reset-side level shift circuit 21b. The set-side level shift circuit 21a shifts the DC level of the set signal set outputted by the set-side pulse generation circuit 13a while inverting the set signal set, and outputs the inverted set signal set to the high-side control circuit 22 as the level-shifted set signal setdrn (see FIG. 2). Furthermore, the reset-side level shift circuit 21b shifts the DC level of the reset signal res outputted by the reset-side pulse generation circuit 13b while inverting the reset signal res, and outputs the inverted reset signal res to the high-side control circuit 22 as the level-shifted reset signal resdrn (see FIG. 2).

The set-side level shift circuit 21a includes a set-side level shift switching device 211a and a resistor 212a. The reset-side level shift circuit 21b includes a reset-side level shift switching device 211b and a resistor 212b.

The level shift switching devices 211a and 211b are N-channel MOSFETs having high voltage resistance, but may be IGTBs, bipolar transistors, or the like. The threshold voltage (e.g., 1.5 V) of the set-side level shift circuit 211a is set to be lower than the breakdown voltage (e.g., 5.5 V) of the set-side zener diode 135a, and the threshold voltage of the reset-side level shift circuit 211b is set to be lower than the breakdown voltage of the reset-side zener diode 135b. The threshold voltage refers to a gate-source voltage when the level shift switching device 211a or 211b is on. Note that when the level shift switching device 211a or 211b is a bipolar transistor, the threshold voltage is a voltage (e.g., 0.7 V) when the bipolar transistor is on.

The resistor 212a and the set-side level shift switching device 211a are coupled in series between the high-potential output terminal of the high-side DC power supply 6 and the ground. Specifically, the drain of the set-side level shift switching device 211a is coupled to the high-potential output terminal of the high-side DC power supply 6 via the resistor 212a, and the source of the set-side level shift switching device 211a is coupled to the ground.

The resistor 212b and the reset-side level shift switching device 211b are coupled in series between the high-potential output terminal of the high-side DC power supply 6 and the ground. Specifically, the drain of the reset-side level shift switching device 211b is coupled to the high-potential output terminal of the high-side DC power supply 6 via the resistor 212b, and the source of the reset-side level shift switching device 211b is coupled to the ground.

An anode of the diode 28 is coupled to the node N2 and a cathode of the diode 28 is coupled to a node N5 between the resistor 212a and the set-side level shift switching device 211a. Since the diode 28 clamps the potential of the node N5 to the potential of the node N2, the reference of the voltage at the node N5 is the potential of N2. Accordingly, overvoltage is prevented from being inputted to the high-side control circuit 22.

An anode of the diode 29 is coupled to the node N2 and a cathode of the diode 29 is coupled to a node N6 between the resistor 212b and the reset-side level shift switching device 211b. Since the diode 29 clamps the potential of the node N6 to the potential of the node N2, the reference of the voltage at the node N6 is the potential of the node N2. Accordingly, overvoltage is prevented from being inputted to the high-side control circuit 22.

The gate of the set-side level shift switching device 211a is coupled to the output terminal of the set-side pulse generation circuit 13a, that is, the node N3 between the switching device 133a and the switching device 134a. The set signal set outputted by the set-side pulse generation circuit 13a is inputted to the gate of the set-side level shift switching device 211a. The set-side level shift switching device 211a is turned on and off based on the set signal set. When the set-side level shift switching device 211a is turned off, the drain voltage (voltage at the node N5) is risen to the high level by the high-side DC power supply 6. When the set-side level shift switching device 211a is turned on, the voltage at the node N5 is lowered to the low level by the ground. The voltage at the node N5 is inputted to the high-side control circuit 22 as the level-shifted set signal setdrn.

The gate of the reset-side level shift switching device 211b is coupled to the output terminal of the reset-side pulse generation circuit 13b, that is, the node N4 between the switching device 133b and the switching device 134b. The reset signal res outputted by the reset-side pulse generation circuit 13b is inputted to the gate of the reset-side level shift switching device 211b. The reset-side level shift switching device 211b is turned on and off based on the reset signal res. When the reset-side level shift switching device 211b is turned off, the voltage at the node N6 is risen to the high level by the high-side DC power supply 6. When the reset-side level shift switching device 211b is turned on, the voltage at the node N6 is lowered to the low level by the ground. The voltage at the node N6 is inputted to the high-side control circuit 22 as the level-shifted reset signal resdrn.

The timing in which the level-shifted set signal setdrn is low is shifted in time from the timing in which the level-shifted reset signal resdrn is low.

<<<2-6. High-side Control Circuit>>>

The high-side control circuit 22 generates the output signal HO based on the level-shifted set signal setdrn and the level-shifted reset signal resdrn, and outputs the output signal HO to the gate of the power switching device 51. The high-side control circuit 22 thereby turns on and off the power switching device 51. When the level-shifted set signal setdrn is low and the level-shifted reset signal resdrn is high, the high-side control circuit 22 causes the output signal HO to be high. When both of the level-shifted set signal setdrn and the level-shifted reset signal resdrn are low or high, the high-side control circuit 22 maintains the level of the output signal HO. When the level-shifted set signal setdrn is high and the level-shifted reset signal resdrn is low, the high-side control circuit 22 causes the output signal HO to be low.

The high-side control circuit 22 includes a protection circuit 221, the latch circuit 222, and a high-side driver 223.

The protection circuit 221 is applied with the voltage of the high-side DC power supply 6 with respect to the potential of the node N2. Moreover, the protection circuit 221 receives the level-shifted set signal setdrn and the level-shifted reset signal resdrn. The protection circuit 221 controls the latch circuit 222 based on the level-shifted set signal setdrn and the level-shifted reset signal resdrn. As illustrated in FIG. 2, when the level-shifted set signal setdrn is low and the level-shifted reset signal resdrn is high, the protection circuit 221 outputs a high-level signal to the latch circuit 222. When the level-shifted set signal setdrn is high and the level-shifted reset signal resdrn is low, the protection circuit 221 outputs a low-level signal to the latch circuit 222. When both of the level-shifted set signal setdrn and the level-shifted reset signal resdrn are low or high, the protection circuit 221 causes the output to be high impedance.

The output voltage of the high-side DC power supply 6 with respect to the potential of the node N2 is supplied to the latch circuit 222. The latch circuit 222 is controlled according to the output of the protection circuit 221. When the output of the protection circuit 221 (input of the latch circuit 222) is high or low, the latch circuit 222 stores and outputs the value of the output. Moreover, when the output of the protection circuit 221 changes to the high impedance, the latch circuit 222 holds and outputs the value stored immediately before the change in the output of the protection circuit 221 to the high impedance.

Assume a case where the drive circuit 1 is normal. When the level-shifted set signal setdrn is low and the level-shifted reset signal resdrn is high, the output of the latch circuit 222 is high. Then, when both of the level-shifted set signal setdrn and the level-shifted reset signal resdrn are low, the output of the latch circuit 222 is held high. When the level-shifted set signal setdrn is high and the level-shifted reset signal resdrn is low, the output of the latch circuit 222 is low. Then, when both of the level-shifted set signal setdrn and the level-shifted reset signal resdrn are low, the output of the latch circuit 222 is held low.

Meanwhile, when the potentials at the nodes N5 and N6 change, dv/dt noise is caused by parasitic capacitances of the level shift switching devices 211*a* and 211*b*, and the like, so that currents flow through the level shift switching devices 211*a* and 211*b* concurrently. This causes both of the level-shifted set signal setdrn and the level-shifted reset signal resdrn to erroneously go low. Accordingly, the output of the protection circuit 221 is at high impedance, and the level of the output of the latch circuit 222 is held.

The high-side driver 223 is supplied with the output voltage of the high-side DC power supply 6 with respect to the potential of the node N2. Moreover, the high-side driver 223 receives the output of the latch circuit 222. The high-side driver 223 generates the output signal HO according to the output of the latch circuit 222, and outputs the output signal HO to the gate of the power switching device 51. Specifically, the high-side driver 223 causes the output signal HO to be low when the output of the latch circuit 222 is low, and causes the output signal HO to be high when the output of the latch circuit 222 is high.

Note that the components of the hi-side control circuit 22 may be those disclosed in Japanese Patent Publication No. 3429937.

<<<2-7. Buffer Circuit>>>

As illustrated in FIGS. 1 and 3, the buffer circuit 14 is supplied with the output voltage of the external power supply 4.

The buffer circuit 14 outputs a signal in phase with the input signal HIN and a signal of opposite phase to the input signal HIN, to the input-control-state-ensuring circuit 15.

The buffer circuit 14 includes inverters 141 and 142.

The input signal HIN is inputted to the inverter 141. The inverter 141 inverts the input signal HIN, and outputs the signal having a phase opposite to the phase of the input signal HIN, to the inverter 142 and the input-control-state-ensuring circuit 15. The inverter 142 inverts the output of the inverter 141, and outputs a signal in phase with the input signal HIN to the input-control-state-ensuring circuit 15.

Note that the output signal of the input circuit 12 may be inputted to the buffer circuit 14, instead of the input signal HIN.

<<<2-8. Input-Control-State-Ensuring Circuit>>>

The input-control-state-ensuring circuit 15 is supplied with the output voltage of the external power supply 4.

The input-control-state-ensuring circuit 15 includes a set-side input-control-state-ensuring circuit 15*a* and a reset-side input-control-state-ensuring circuit 15*b*.

In the set-side input-control-state-ensuring circuit 15*a*, when the input signal HIN is high, the voltage at the output terminal of the set-side pulse generation circuit 13*a*, that is, the voltage at the node N3 between the switching device 133*a* and the switching device 134*a*, is pulled up by the external power supply 4, based on the output of the inverter 141 of the buffer circuit 14. Further, in the set-side input-control-state-ensuring circuit 15*a*, when the input signal HIN is low, the voltage at the node N3 is pulled down by grounding, based on the output of the inverter 141 of the buffer circuit 14. Here, the pulling up and pulling down of the voltage at the node N3 does not affect the operation of turning on and off the set-side level shift switching device 211*a* performed by the set-side pulse generation circuit 13*a*.

In the reset-side input-control-state-ensuring circuit 15*b*, when the input signal HIN is low, the voltage at the output terminal of the reset-side pulse generation circuit 13*b*, that is, the voltage at the node N4 between switching device 133*b* and the switching device 134*b*, is pulled up by the external power supply 4, based on the output signal of the inverter 142 of the buffer circuit 14. Further, in the reset-side input-control-state-ensuring circuit 15*b*, when the input signal HIN is high, the voltage at the node N4 is pulled down by grounding, based on the output signal of the inverter 142 of the buffer circuit 14. The pulling up and pulling down of the voltage at the node N4 does not affect the operation of turning on and off the reset-side level shift switching device 211*b* performed by the reset-side pulse generation circuit 13*b*.

The set-side input-control-state-ensuring circuit 15*a* includes the switching device (first switching device) 151*a*, the switching device (second switching device) 152*a*, and a set-side resistor 153*a*. The reset-side input-control-state-ensuring circuit 15*b* includes the switching device (fifth switching device) 151*b*, the switching device (sixth switching device) 152*b*, and a reset-side resistor 153*b*. The switching devices 151*a* and 151*b* are P-channel MOSFETs, and the switching devices 152*a* and 152*b* are N-channel MOSFETs.

The source of the switching device 151*a* is coupled to the external power supply 4. The set-side resistor 153*a* is coupled between the drain of the switching device 151*a* and the drain of the switching device 152*a*. The source of the switching device 152*a* is grounded resulting in the reference potential. The gates of the switching device 151*a* and the switching device 152*a* are coupled to the output terminal of the inverter 141 of the buffer circuit 14. The node between the set-side resistor 153*a* and switching device 152*a* is coupled to the output terminal of the set-side pulse generation circuit 13*a*, that is, the node N3 between the switching device 133*a* and the switching device 134*a*.

The source of the switching device 151*b* is coupled to the external power supply 4. The reset-side resistor 153*b* is coupled between the drain of the switching device 151*b* and the drain of the switching device 152*b*. The source of the switching device 152*b* is grounded resulting in the reference potential. The gates of the switching device 151*b* and the switching device 152*b* are coupled to the output terminal of the inverter 142 of the buffer circuit 14. The node between the reset-side resistor 153*b* and the switching device 152*b* is coupled to the output terminal of the reset-side pulse generation circuit 13*b*, that is, the node N4 between the switching device 133*b* and the switching device 134*b*.

The output signal of the inverter 141 is inputted to the gates of the switching devices 151*a* and 152*a*, thereby turning on and off the switching device 151*a* in a manner in phase with the input signal HIN, and turning on and off the switching device 152*a* complimentarily to the switching device 151*a*. When the input signal HIN is high, that is, when the output signal of the inverter 141 is low, the switching device 151*a* is on and the switching device 152*a* is off. Accordingly, the voltage at the output terminal (i.e., node N3) of the set-side pulse generation circuit 13*a* is pulled up by the external power supply 4. Meanwhile, when the input signal HIN is low, that is, when the output signal of the inverter 141 is high, the switching device 151*a* is off and the switching device 152*a* is on. Accordingly, the voltage at the output terminal of the set-side pulse generation circuit 13a is pulled down by grounding.

Here, assuming that the On-state resistance value of the switching device 133a is R133a [Ω], the resistance value of the set-side resistor 153a is R153a [Ω], and the On-state resistance value of the switching device 151a is R151a [Ω], Expression (1) is given below.

[Expression 1]

$$R_{133a} \ll R_{153a} + R_{151a} \quad (1)$$

Thus, when the switching devices 133a and 151a are on and the switching devices 134a and 152a are off, the voltage at the node N3 is determined by the voltage of the internal power supply 11 and the On-state resistance of the switching device 133a, substantially without being affected by the external power supply 4. In other words, the level of the set signal set that is high is only slightly pulled up by the external power supply 4. Accordingly, overvoltage does not occur at the gate of the set-side level shift switching device 211a.

Further, assuming that the On-state resistance value of the switching device 134a is R134$_a$ [Ω], the output voltage value of the external power supply 4 is VCC [V], and the threshold voltage value of the set-side level shift switching device 211a is VTHa [V], Expression (2) is given below.

[Expression 2]

$$V_{THa} > \frac{R_{134a}}{R_{134a} + R_{153a} + R_{151a}} V_{CC} \quad (2)$$

Thus, when the switching devices 134a and 151a are on and the switching devices 133a and 152a are off, the voltage at the node N3 is lower than the threshold voltage of the set-side level shift switching device 211a, even if the voltage at the node N3 is pulled up by the external power supply 4. Accordingly, the set-side level shift switching device 211a is turned off. Note that the set-side resistor 153a may not be provided as long as the On-state resistance value of the switching device 151a is sufficiently large. This results in R153a=0 in the aforementioned two expressions.

The output signal of the inverter 142 is inputted to the gates of the switching devices 151b and 152b, thereby turning on and off the switching device 151b in a manner in phase with the input signal HIN, and turning on and off the switching device 152b complimentarily to the switching device 151b. When the input signal HIN is high, that is, when the output signal of the inverter 142 is high, the switching device 152b is on and the switching device 151b is off. Accordingly, the voltage at the output terminal (i.e., node N4) of the reset-side pulse generation circuit 13b is pulled down by grounding. Meanwhile, when the input signal HIN is low, that is, when the output signal of the inverter 142 is low, the switching device 152b is off and the switching device 151b is on. Accordingly, the voltage at the output terminal of the reset-side pulse generation circuit 13b is pulled up by the external power supply 4.

Here, assuming that the On-state resistance value of the switching device 133b is R133b [Ω], the resistance value of the reset-side resistor 153b is R153b [Ω], the On-state resistance value of the switching device 151b is R151b [Ω], the On-state resistance value of the switching device 134b is R134b [Ω], the output voltage value of the external power supply 4 is VCC [V], and the threshold voltage value of the reset-side level shift switching device 211b is VTHb [V], Expressions (3) and (4) are given below.

[Expression 3]

$$R_{133b} \ll R_{153b} + R_{151b} \quad (3)$$

[Expression 4]

$$V_{THb} > \frac{R_{134b}}{R_{134b} + R_{153b} + R_{151b}} V_{CC} \quad (4)$$

With Expression (3), when the switching devices 133b and 151b are on and the switching devices 134b and 152b are off, the level of the reset signal res that is high is only slightly pulled up by the external power supply 4. Accordingly, overvoltage does not occur at the gate of the reset-side level shift switching device 211b.

Further, with Expression (4), when the switching devices 134b and 151b are on and the switching devices 133b and 152b are off, the voltage at the node N4 is lower than the threshold voltage of the reset-side level shift switching device 211b, even if the voltage at the node N4 is pulled up by the external power supply 4. Accordingly, the reset-side level shift switching device 211b is turned off. Note that the reset-side resistor 153b may not be provided, as long as the On-state resistance value of the switching device 151b is sufficiently large. This results in R153b=0 in the aforementioned two expressions.

The operation delay time of the combination of the aforementioned buffer circuit 14 and set-side input-control-state-ensuring circuit 15a is smaller than the operation delay time of the combination of the input circuit 12 and set-side pulse generation circuit 13a. This is because the noise filter 122 of the input circuit 12 is a low-pass filter, and the output signal of the noise filter 122 is delayed with respect to the input signal.

Similarly, the operation delay time of the combination of the aforementioned buffer circuit 14 and reset-side input-control-state-ensuring circuit 15b is smaller than the operation delay time of the combination of the input circuit 12 and reset-side pulse generation circuit 13b.

3. CASE WHERE NEGATIVE VOLTAGE IS GENERATED

Figure 5:
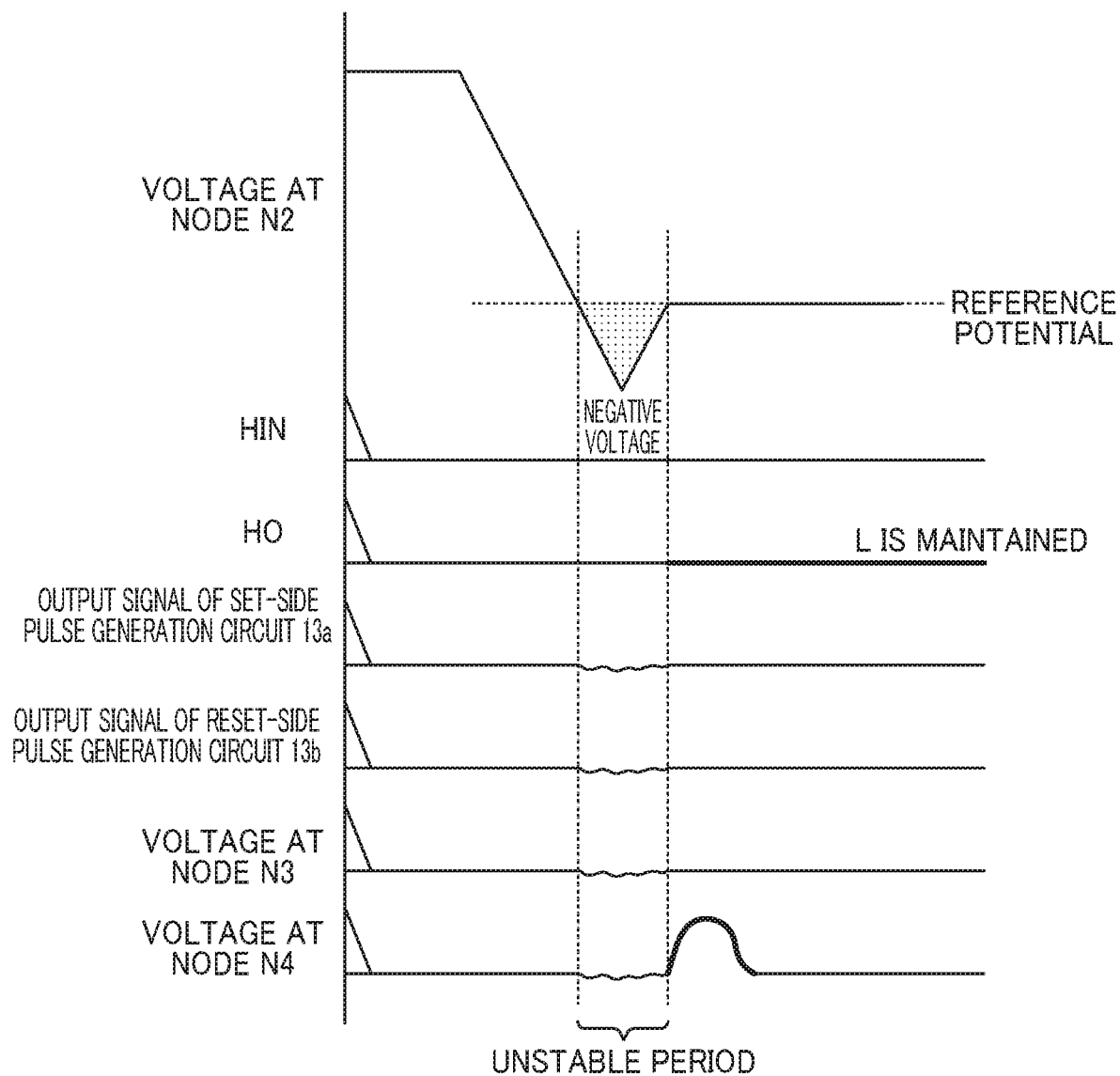
Figure 6:
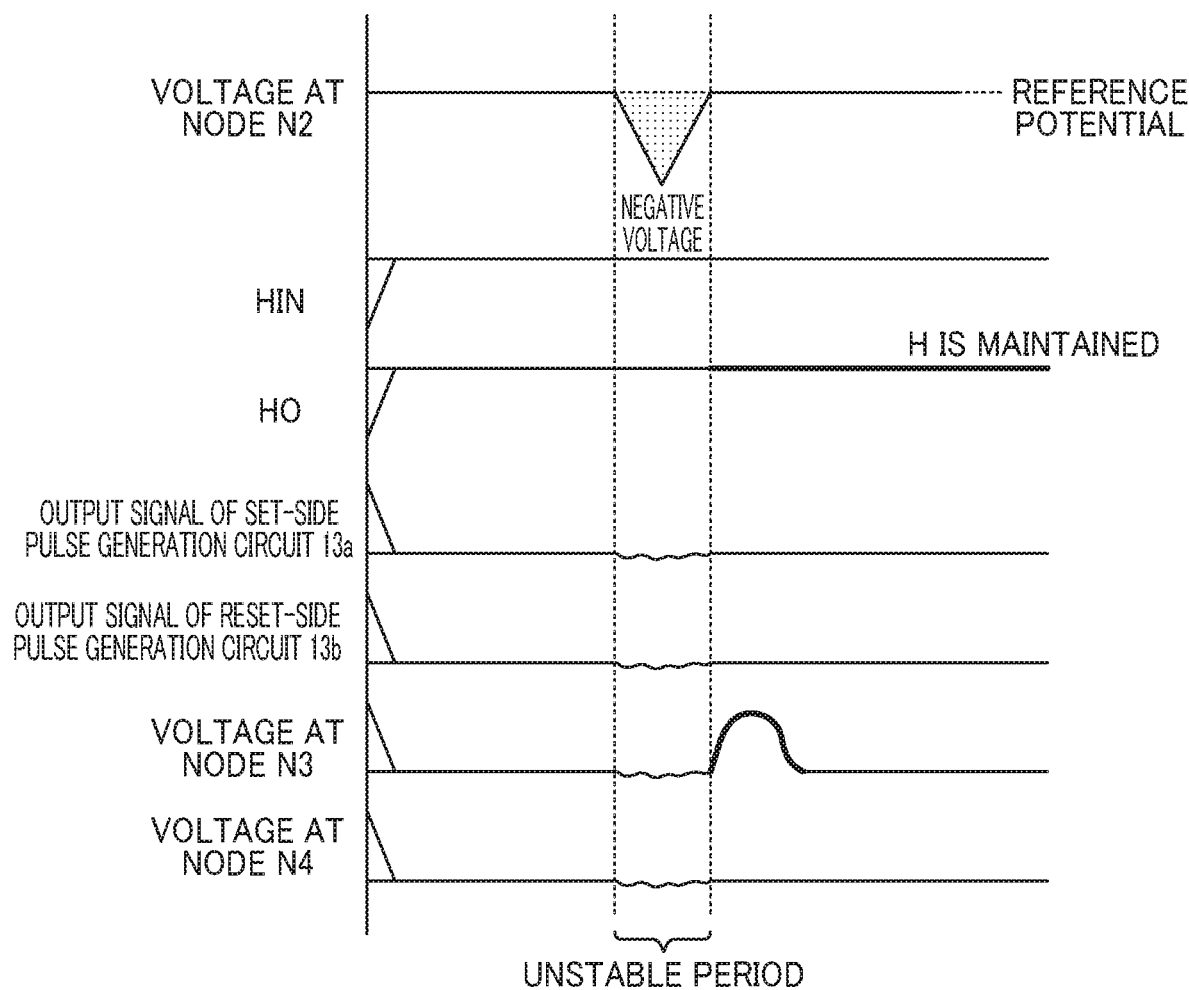
FIG. 6 is a timing chart illustrating, on a time axis, relationships among voltages at nodes, an input signal, an output signal, and output signals of pulse generation circuits, after a high-side power switching device is switched on from off.

As illustrated in the charts of FIGS. 5 and 6, the voltage at the node N2 may become negative by being affected by the inductance of the load 9 and dv/dt, after the power switching devices 51 and 52 are switched between on and off, that is, after the rising or falling of the input signal HIN and the output signal HO. Also in the case where external noise, such as a three-phase current, a lighting surge, and an ESD surge, occurs, the voltage at the node N2 may become negative.

When the voltage at the node N2 becomes negative, the operation of the preceding-stage circuit 10 becomes unstable by being affected by the subsequent-stage circuit 20.

Particularly, the internal power supply 11 does not operate normally, and the input circuit 12 and the pulse generation circuit 13 do not operate normally, either. Specifically, the output voltage from the internal power supply 11 drops, and the output of the pulse generation circuit 13 may become a high impedance state. In such a case, the output signals of the set-side pulse generation circuit 13a and the reset-side pulse generation circuit 13b (set signal set, reset signal res) are unstable. Accordingly, when the voltage at the node N2 has recovered to the normal state from the negative voltage state, the output signals of the set-side pulse generation circuit 13a and the reset-side pulse generation circuit 13b become indefinite.

However, the microcomputer and the external power supply 4 that output the input signals HIN are not affected by the subsequent-stage circuit 20. Thus, even if the voltage at the node N2 becomes negative, the microcomputer and the external power supply 4 operate normally. Thus, the buffer circuit 14, the set-side input-control-state-ensuring circuit 15a, and the reset-side input-control-state-ensuring circuit 15b, which are supplied with the voltage of the external power supply 4, operate normally. Accordingly, when the node N2 has recovered to the normal state from the negative voltage state, even if the output signals of the set-side pulse generation circuit 13a and the reset-side pulse generation circuit 13b are unstable, the high-side control circuit 22 does not erroneously operate. Hence, the output signal HO of the high-side control circuit 22 remains in the state before the occurrence of the negative voltage at the node N2, even after recovering to the normal state. This will be described below more specifically.

<<<3-1. Case Where Output Signal HO is Low>>>

When the input signal HIN falls, the output signal of the reset-side pulse generation circuit 13b (reset signal res) temporarily goes high and, thereafter, both of the output signals of the reset-side pulse generation circuit 13b and the set-side pulse generation circuit 13a (set signal set) go low (see FIG. 2). Accordingly, the output signal HO of the high-side control circuit 22 goes low.

Then, after the power switching devices 51 and 52 are switched between on and off, when the voltage at the node N2 becomes negative as illustrated in FIG. 5, due to the effects of the inductance of the load 9 and dv/dt or the effects of external noise and the like, the switching device 152a is turned on although the output signal of the set-side pulse generation circuit 13a is unstable. Thus, the voltage at the output terminal (i.e., node N3) of the set-side pulse generation circuit 13a is pulled down by grounding. This causes the output signal HO of the high-side control circuit 22 to remain high, without the set-side level shift switching device 211a being turned on. Meanwhile, since the switching device 151b is turned on, the voltage at the output terminal (i.e., node N4) of the reset-side pulse generation circuit 13b is pulled up by the external power supply 4. Accordingly, the output signal of the reset-side pulse generation circuit 13b is unstable, thereby causing the output signal HO of the high-side control circuit 22 to remain low, irrespective of whether the reset-side level shift switching device 211b is turned on or not.

Thereafter, the voltage at the node N2 recovers to the normal state from the negative voltage stage, and the internal power supply 11, the input circuit 12, and the pulse generation circuit 13 recover. In this case, since the switching device 152a is turned on, the voltage at the output terminal of the set-side pulse generation circuit 13a is pulled down by grounding. Thus, even if the output signal of the set-side pulse generation circuit 13a is unstable at the time of recovery, the output signal HO of the high-side control circuit 22 remains low, without the set-side level shift switching device 211a being turned on. Meanwhile, since the switching device 151b is turned on, the voltage at the output terminal of the reset-side pulse generation circuit 13b is pulled up by the external power supply 4. Accordingly, even if the output signal of the reset-side pulse generation circuit 13b is unstable, the output signal HO of the high-side control circuit 22 remains low, irrespective of whether the reset-side level shift switching device 211b being turned on or not. Note that, here, the case where the reset-side level shift switching device 211b is on indicates, for example, the case where the switching device 134b is off, the voltage at the node N4 is pulled up to result in the breakdown voltage of the reset-side zener diode 135b. Meanwhile, the case where the reset-side level shift switching device 211b is off indicates, for example, the switching device 134b is on, and the voltage at the node N4 is lower than the threshold voltage.

Here, as has been described above, the operation delay time of the combination of the buffer circuit 14 and the set-side input-control-state-ensuring circuit 15a is smaller than the operation delay time of the combination of the input circuit 12 and the set-side pulse generation circuit 13a. Thus, the voltage at the node N3 is influenced by the output of the set-side input-control-state-ensuring circuit 15a before the output signal of the set-side pulse generation circuit 13a becomes unstable or indefinite. Accordingly, the erroneous operation of the set-side level shift switching device 211a can be prevented.

<<<3-2. Case Where Output Signal HO is High>>>

After the rising of the input signal HIN, when both of the output signals of the reset-side pulse generation circuit 13b and the set-side pulse generation circuit 13a (set signal set) are low, the output signal HO of the high-side control circuit 22 is high. In this case, when the voltage at the node N2 becomes negative as illustrated in FIG. 6, due to the effects of external noise and the like, the switching device 152b is turned on although the output signal of the reset-side pulse generation circuit 13b is unstable. This causes the voltage at the output terminal of the reset-side pulse generation circuit 13b to be pulled down by grounding. Accordingly, the output signal HO of the high-side control circuit 22 remains high, without the reset-side level shift switching device 211b being turned on.

Thereafter, also when the voltage at the node N2 recovers to the normal state from the negative voltage state, the switching device 152a is turned on, and thus the voltage at the output terminal of the reset-side pulse generation circuit 13b is pulled down by grounding. Accordingly, even if the output signal of the reset-side pulse generation circuit 13b is unstable at the time of recovery, the output signal HO of the high-side control circuit 22 remains high, without the reset-side level shift switching device 211b being turned on. Further, since the switching device 151a is turned on, the voltage at the output terminal of the set-side pulse generation circuit 13a is pulled up by the external power supply 4. Thus, when the voltage at the node N2 is in the negative voltage state and thereafter recovers to the normal state, the output signal HO of the high-side control circuit 22 remains high, irrespective of whether the set-side level shift switching device 211a is turned on or not. Note that whether the set-side level shift switching device 211a is turned on or not depends on the state of the switching device 134a, similarly to whether the reset-side level shift switching device 211b is turned on or not.

4. SUMMARY (1) When the voltage at the node N2 becomes negative, the internal power supply 11, the input circuit 12, and the pulse generation circuit 13 may not operate normally. However, the buffer circuit 14 and the input-control-state-ensuring circuit 15 operate normally by virtue of the external power supply 4 and the input signal HIN. Accordingly, the following advantageous effects (2) to (5) are produced.

(2) When the input signal HIN is low, the voltage at the output terminal (i.e., node N3) of the set-side pulse generation circuit 13a is pulled down by grounding. Thus, even if the voltage at the node N2 becomes negative, the set-side level shift switching device 211a is not turned on. Accordingly, the output signal HO of the high-side control circuit 22 remains low.

(3) When the input signal HIN is high, the voltage at the output terminal (i.e., node N4) of the reset-side pulse generation circuit 13b is pulled down by grounding. Thus, even if the voltage at the node N2 becomes negative, the reset-side level shift switching device 211b is not turned on. Accordingly, the output signal HO of the high-side control circuit 22 remains high.

(4) When the input signal HIN is low, the voltage at the output terminal of the reset-side pulse generation circuit 13b is pulled up by the external power supply 4. Thus, even if the voltage at the node N2 becomes negative, the reset-side level shift switching device 211b is likely to be turned on. Accordingly, the output signal HO of the high-side control circuit 22 remains low.

(5) When the input signal HIN is high, the voltage at the output terminal of the set-side pulse generation circuit 13a is pulled up by the external power supply 4. Thus, even if the voltage at the node N2 becomes negative, the set-side level shift switching device 211a is likely to be turned on. Accordingly, the output signal HO of the high-side control circuit 22 remains high.

(6) Assume the internal power supply 11, the input circuit 12, and the pulse generation circuit 13 operate normally. Even if the voltage at the output terminal of the set-side pulse generation circuit 13a is pulled up by the external power supply 4, the voltage at the output terminal of the set-side pulse generation circuit 13a does not exceed the withstand voltage of the set-side level shift switching device 211a when the set signal set is high. This is because the aforementioned Expression (1) is satisfied. Similarly, since the aforementioned Expression (3) is satisfied, when the reset signal res is high, the voltage at the output terminal of the reset-side pulse generation circuit 13b does not exceed the withstand voltage of the reset-side level shift switching device 211b.

(7) Assume the internal power supply 11, the input circuit 12, and the pulse generation circuit 13 operate normally. Even if the voltage at the output terminal of the set-side pulse generation circuit 13a is pulled up by the external power supply 4, when the set signal set is low, the voltage at the output terminal of the set-side pulse generation circuit 13a does not exceed the withstand voltage of the set-side level shift switching device 211a, and the set-side level shift switching device 211a is off. This is because the aforementioned Expression (2) is satisfied. Similarly, since the aforementioned Expression (4) is satisfied, when the reset signal res is low, the reset-side level shift switching device 211b is off.

(8) With the voltage at the node N2 being negative, when the internal power supply 11, the input circuit 12, and the pulse generation circuit 13 do not operate normally, both of the switching devices 133a and 134a may be turned off. In this case, when the output signal causes the switching device 151a to be turned on and the switching device 152a to be turned off, the voltage at the output terminal of the set-side pulse generation circuit 13a is clamped by the set-side zener diode 135a so as not to exceed the breakdown voltage of the set-side zener diode 135a. Thus, overvoltage is not applied to the gate of the set-side level shift switching device 211a, so that the set-side level shift switching device 211a can be prevented from being broken. Similarly, when the internal power supply 11, the input circuit 12, and the pulse generation circuit 13 do not operate normally, and the switching device 151b is turned on and the switching device 152b is turned off, overvoltage is not applied to the gate of the reset-side level shift switching device 211b, so that the reset-side level shift switching device 211b can be prevented from being broken.

(9) The operation delay time of the combination of the buffer circuit 14 and the input-control-state-ensuring circuit 15 is smaller than the operation delay time of the combination of the input circuit 12 and the pulse generation circuit 13. Thus, the voltages at the nodes N3 and N4 are influenced by the output of the input-control-state-ensuring circuit 15, before the output signal of the pulse generation circuit 13 becomes unstable or indefinite due to the voltage at the node N2 becoming negative. Accordingly, the erroneous operation of the level shift switching devices 211a and 211b can be prevented.

5. MODIFIED EXAMPLES

Note that embodiments described above are presented to facilitate the understanding of the present disclosure and is not for interpreting the present disclosure in a limited manner. Moreover, the present disclosure can be modified or improved without departing from the gist of the disclosure and equivalents of the present disclosure are included in the present disclosure as a matter of course.

For example, the input circuit 12 may include a delay circuit so as to cause the delay time of the input circuit 12 and the pulse generation circuit 13 to be longer than the delay time of the buffer circuit 14 and the input-control-state-ensuring circuit 15.

What is claimed is:

1. A drive circuit of a power device, comprising:
  an internal power supply;
  a set-side pulse generation circuit and a reset-side pulse generation circuit that are connected to the internal power supply and that receive a logic input signal, the set-side pulse generation circuit generating a set signal upon detecting that the logic input signal changes from a first logic level to a second logic level, the reset-side pulse generation circuit generating a reset signal upon detecting that the logic input signal changes from the second logic level to the first logic level;
  a set-side level shift circuit that generates a level-shifted set signal by shifting a level of the set signal;
  a reset-side level shift circuit that generates a level-shifted reset signal by shifting a level of the reset signal;
  a control circuit that turns on the power device responsive to the level-shifted set signal, and turns off the power device responsive to the level-shifted reset signal; and
  an ensuring circuit that ensures, based on the logic input signal, a first state in which the power device is off when the logic input signal is at the first logic level, and a second state in which the power device is on when the logic input signal is at the second logic level.

2. The drive circuit according to claim 1, wherein the ensuring circuit includes:
  a set-side ensuring circuit that pulls down an output voltage of the set-side pulse generation circuit using a reference potential, when the logic input signal is at the first logic level; and a reset-side ensuring circuit that pulls down an output voltage of the reset-side pulse generation circuit using the reference potential, when the logic input signal is at the second logic level.

3. The drive circuit according to claim 2, wherein
the set-side ensuring circuit pulls up the output voltage of the set-side pulse generation circuit using an external power supply, when the logic input signal is at the second logic level, and
the reset-side ensuring circuit pulls up an output voltage of the reset-side pulse generation circuit using the external power supply, when the logic input signal is at the first logic level.

4. The drive circuit according to claim 3, wherein the set-side ensuring circuit includes:
a first switching device coupled to the external power supply, the first switching device being configured to be on when the logic input signal is at the second logic level, and be off when the logic input signal is at the first logic level, and
a second switching device coupled in series with the first switching device, via a set-side resistor, between the reference potential and the external power supply, the second switching device being configured to be turned on and off complementarily to the first switching device, based on the logic input signal; and
a node between the set-side resistor and the second switching device is coupled to an output of the set-side pulse generation circuit.

5. The drive circuit according to claim 4, wherein the set-side pulse generation circuit includes:
a set-side edge detection circuit that detects that the logic input signal changes from the first logic level to the second logic level,
a third switching device coupled to the internal power supply, the third switching device being configured to be turned on and off based on an output signal of the set-side edge detection circuit, and
a fourth switching device coupled in series with the third switching device between the reference potential and the internal power supply, the fourth switching device being configured to be turned on and off complementarily to the third switching device, based on the output signal of the set-side edge detection circuit; and
a node between the third switching device and the fourth switching device is coupled to the node between the set-side resistor and the second switching device, wherein
the set-side pulse generation circuit outputs, to the set-side level shift circuit, a voltage at the node between the third switching device and the fourth switching device, as the set signal.

6. The drive circuit according to claim 5, wherein
an On-state resistance value of the third switching device is smaller than a sum of an On-state resistance value of the first switching device and a resistance value of the set-side resistor.

7. The drive circuit according to claim 5, wherein
the set-side level shift circuit includes a set-side level shift switching device coupled between a high-side power supply and the reference potential, the set-side level shift switching device being configured to be turned on and off based on the set signal, and
the set-side level shift circuit outputs, to the control circuit, a voltage at a terminal of the set-side level shift switching device that is connected to the high-side power supply, as the level-shifted set signal.

8. The drive circuit according to claim 7, wherein
the output voltage of the set-side pulse generation circuit when the first switching device and the fourth switching device are on and the second switching device and the third switching device are off is lower than a threshold voltage of the set-side level shift switching device.

9. The drive circuit according to claim 7, wherein
a threshold voltage of the set-side level shift switching device is greater than a product obtained by multiplying, by a voltage of the external power supply, a quotient that is obtained by dividing an On-state resistance value of the fourth switching device by a sum of the On-state resistance value of the fourth switching device, a resistance value of the set-side resistor, and an On-state resistance value of the first switching device.

10. The drive circuit according to claim 7, wherein
the set-side pulse generation circuit further includes a set-side clamp device that clamps a voltage at the node between the third switching device and the fourth switching device, to a voltage lower than a predetermined voltage.

11. The drive circuit according to claim 10, wherein
the set-side clamp device is a set-side zener diode coupled to the node between the third switching device and the fourth switching device in a reverse biased manner,
the predetermined voltage is a breakdown voltage of the set-side zener diode, and
a threshold voltage of the set-side level shift switching device is lower than the breakdown voltage of the set-side zener diode.

12. The drive circuit according to claim 3, wherein
the reset-side ensuring circuit includes:
a fifth switching device coupled to the external power supply, the fifth switching device being configured to be on when the logic input signal is at the first logic level, and be off when the logic input signal is at the second logic level, and
a sixth switching device coupled in series with the fifth switching device, via a reset-side resistor, between the reference potential and the external power supply, the sixth switching device being configured to be turned on and off complementarily to the fifth switching device, based on the logic input signal; and
a node between the reset-side resistor and the sixth switching device is coupled to an output of the reset-side pulse generation circuit.

13. The drive circuit according to claim 12, wherein
the reset-side pulse generation circuit includes:
a reset-side edge detection circuit that detects that the logic input signal changes from the second logic level to the first logic level,
a seventh switching device coupled to the internal power supply, the seventh switching device being configured to be turned on and off based on an output signal of the reset-side edge detection circuit, and
an eighth switching device coupled in series with the seventh switching device between the reference potential and the internal power supply, the eighth switching device being configured to be turned on and off complementarily to the seventh switching device, based on the output signal of the reset-side edge detection circuit; and a node between the seventh switching device and the eighth switching device is coupled to the node between the reset-side resistor and the sixth switching device, wherein the reset-side pulse generation circuit outputs, to the reset-side level shift circuit, a voltage at the node between the seventh switching device and the eighth switching device, as the reset signal.

14. The drive circuit according to claim 13, wherein an On-state resistance value of the seventh switching device is smaller than a sum of an On-state resistance value of the fifth switching device and a resistance value of the reset-side resistor.

15. The drive circuit according to claim 13, wherein the reset-side level shift circuit includes a reset-side level shift switching device coupled between a high-side power supply and the reference potential, the reset-side level shift switching device being configured to be turned on and off based on the reset signal, and the reset-side level shift circuit outputs, to the control circuit, a voltage at a terminal of the reset-side level shift switching device that is connected to the high-side power supply, as the level-shifted reset signal.

16. The drive circuit according to claim 15, wherein the output voltage of the reset-side pulse generation circuit when the fifth switching device and the eighth switching device are on and the sixth switching device and the seventh switching device are off is lower than a threshold voltage of the reset-side level shift switching device.

17. The drive circuit according to claim 15, wherein a threshold voltage of the reset-side level shift switching device is greater than a product obtained by multiplying, by a voltage of the external power supply, a quotient obtained by dividing an On-state resistance value of the eighth switching device by a sum of the On-state resistance value of the eighth switching device, a resistance value of the reset-side resistor, and an On-state resistance value of the fifth switching device.

18. The drive circuit according to claim 15, wherein the reset-side pulse generation circuit further includes a reset-side clamp device that clamps a voltage at the node between the seventh switching device and the eighth switching device, to a voltage lower than a predetermined voltage.

19. The drive circuit according to claim 18, wherein the reset-side clamp device further includes a reset-side zener diode coupled to the node between the seventh switching device and the eighth switching device in a reverse biased manner, the predetermined voltage is a breakdown voltage of the reset-side zener diode, and a threshold voltage of the reset-side level shift switching device is lower than the breakdown voltage of the reset-side zener diode.

* * * * *